United States Patent
Liu

(10) Patent No.: US 12,471,255 B2
(45) Date of Patent: Nov. 11, 2025

(54) SERVER DEVICE AND FAN CONTROL METHOD THEREOF

(71) Applicant: ACCTON TECHNOLOGY CORPORATION, Hsinchu (TW)

(72) Inventor: Chi Ming Liu, Tainan (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 447 days.

(21) Appl. No.: 18/163,852

(22) Filed: Feb. 2, 2023

(65) Prior Publication Data

US 2023/0320041 A1  Oct. 5, 2023

(30) Foreign Application Priority Data

Mar. 31, 2022 (TW) .................. 111112647

(51) Int. Cl.
*G06F 1/20* (2006.01)
*H05K 7/20* (2006.01)

(52) U.S. Cl.
CPC ..... *H05K 7/20836* (2013.01); *H05K 7/20172* (2013.01); *H05K 7/20736* (2013.01)

(58) Field of Classification Search
CPC ....... G06F 1/20; G06F 1/206; H05K 7/20836; H05K 7/20172; H05K 7/20727; H05K 7/20736; H05K 7/1498; H05K 7/20136; H05K 7/20209; H05K 7/20718; H05K 7/20972
USPC ......................................... 700/300
See application file for complete search history.

(56) References Cited

U.S. PATENT DOCUMENTS

| | | | |
|---|---|---|---|
| 2007/0081888 A1* | 4/2007 | Harrison | F04D 19/007 257/E23.099 |
| 2019/0235597 A1* | 8/2019 | Chen | G06F 11/2015 |
| 2020/0305306 A1* | 9/2020 | Sironi | H05K 7/20209 |
| 2022/0408590 A1* | 12/2022 | Cheng | H05K 7/20136 |

FOREIGN PATENT DOCUMENTS

JP  6548007 B2 *  7/2019

\* cited by examiner

*Primary Examiner* — Chun Cao
(74) *Attorney, Agent, or Firm* — CKC & Partners Co., LLC

(57) ABSTRACT

A server device includes a chassis, plural fan modules and a controller. The fan modules are adapted to be installed in the chassis in a hot-swappable manner. The controller is configured to reduce a fan speed of each fan module in the chassis from a target speed to a temporary speed in response to a fan module insertion event, and then to increase the fan speed of each fan module to the target speed after a predetermined time elapses.

11 Claims, 7 Drawing Sheets

SERVER DEVICE AND FAN CONTROL METHOD THEREOF

CROSS-REFERENCE TO RELATED APPLICATION

This application claims priority to Taiwan Application Serial Number 111112647, filed Mar. 31, 2022, which is herein incorporated by reference in its entirety.

BACKGROUND

Field of the Invention

The present disclosure relates to a server device, and more particularly to a server device with a fan speed adjustment function and a fan control method thereof.

Description of Related Art

Server devices can provide services such as packet routing and data computing depending on the type thereof. Generally speaking, a server device includes fan modules for dissipating the heat energy generated in a working state thereof, so as to prevent the system from overheating and causing unexpected events such as thermal shutdown and significant performance drop. Therefore, whether the fan modules can operate normally to effectively dissipate heat is one of the important factors for maintaining the normal operation of the server device. In practical applications, in order to keep service uninterruptedly, replacement of a fan module needs to be performed while keeping the server device in the working state, or pulling a fan module out of the chassis and then inserting into the chassis for cleaning purpose. However, with the increasing heat dissipation capability requirement for the server device, in addition to the rotational speed capability of a single fan module, the heat dissipation capacity of a single fan module is often insufficient; once a fan module replacement operation is required, the inserted fan module could not be started smoothly due to the internal airflow arisen by the other running fan modules of the server device, thereby affecting the overall heat dissipation efficiency thereof.

SUMMARY

One aspect of the present disclosure directs to a server device which includes a chassis, plural fan modules and a controller. The fan modules are adapted to be installed in the chassis in a hot-swappable manner. The controller is configured to reduce a fan speed of each fan module in the chassis from a target speed to a first temporary speed in response to a fan module insertion event, and then to increase the fan speed of each fan module to the target speed after a first predetermined time elapses.

In accordance with one or more embodiments of the present disclosure, after increase the fan speed of each fan module from the first temporary speed to the target speed, if at least one of the fan modules not running normally is detected, then the controller reduces the fan speed of each fan module from the target speed to a second temporary speed, and then increases the fan speed of each fan module from the second temporary speed to the target speed after a second predetermined time elapses, wherein the second temporary speed is less than the first temporary speed.

In accordance with one or more embodiments of the present disclosure, the second predetermined time is longer than the first predetermined time.

In accordance with one or more embodiments of the present disclosure, the first temporary speed is less than or substantially equal to 50 percent of the target speed.

In accordance with one or more embodiments of the present disclosure, the chassis has plural fan slots at at least one side thereof and adapted to respectively accommodate the fan modules.

In accordance with one or more embodiments of the present disclosure, the controller determines a system abnormal condition if at least one of the fan modules not running normally is still detected after a maximum number of decelerating operations on the fan modules.

In accordance with one or more embodiments of the present disclosure, each fan module includes a three-phase brushless direct current (BLDC) fan, and a three-phase motor driving chip for driving to BLDC fan to rotate.

In accordance with one or more embodiments of the present disclosure, the controller is a complex programmable logic device (CPLD), a field programmable gate array (FPGA), application-specific integrated circuit (ASIC), a microcontroller or a system on a chip (SoC).

In accordance with one or more embodiments of the present disclosure, the chassis includes plural fan slots adapted to respectively accommodate the fan modules.

In accordance with one or more embodiments of the present disclosure, the server device further includes a fan circuit board that is coupled to the controller and is configured to detect and transmit control signals to the fan modules.

Another aspect of the present disclosure directs to a fan control method for a server device having a chassis and plural fan modules that are installed in the chassis in a hot-swappable manner. The fan control method includes: reducing a fan speed of each fan module in the chassis from a target speed to a first temporary speed in response to an event in which one of the fan modules is inserted into the chassis; and increasing the fan speed of each fan module to the target speed after a first predetermined time elapses.

In accordance with one or more embodiments of the present disclosure, the fan control method further includes: reducing the fan speed of each fan module from the target speed to a second temporary speed if at least one of the fan modules not running normally is detected after increasing the fan speed of each fan module from the first temporary speed to the target speed; and increasing the fan speed of each fan module from the second temporary speed to the target speed after a second predetermined time elapses, wherein the second temporary speed is less than the first temporary speed.

In accordance with one or more embodiments of the present disclosure, the second predetermined time is longer than the first predetermined time.

In accordance with one or more embodiments of the present disclosure, the first temporary speed is less than or substantially equal to 50 percent of the target speed.

In accordance with one or more embodiments of the present disclosure, the fan control method further includes: determining a system abnormal condition if at least one of the fan modules not running normally is still detected after a maximum number of decelerating operations on the fan modules.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

Terms used herein are only used to describe the specific embodiments, which are not used to limit the claims appended herewith. Unless limited otherwise, the term "a," "an," "one" or "the" of the single form may also represent the plural form.

It will be understood that, although the terms "first," "second," . . . etc. may be used herein to describe various features, these features should not be limited by these terms. These terms are only used to distinguish one feature from another feature.

The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Figure 1A:
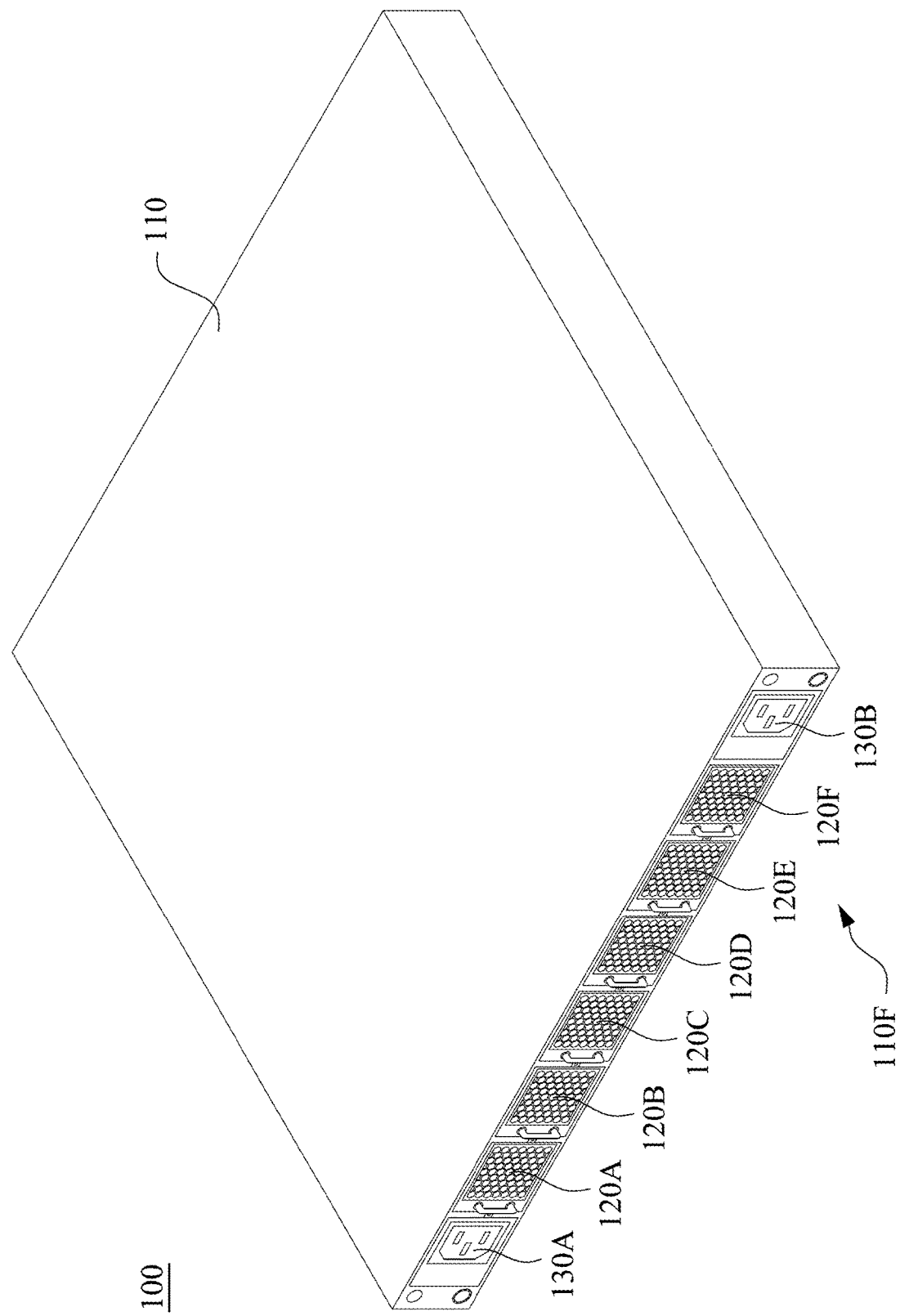
FIG. 1A is a schematic perspective view of a server device in accordance with one or more embodiments of the present disclosure.
Figure 1B:
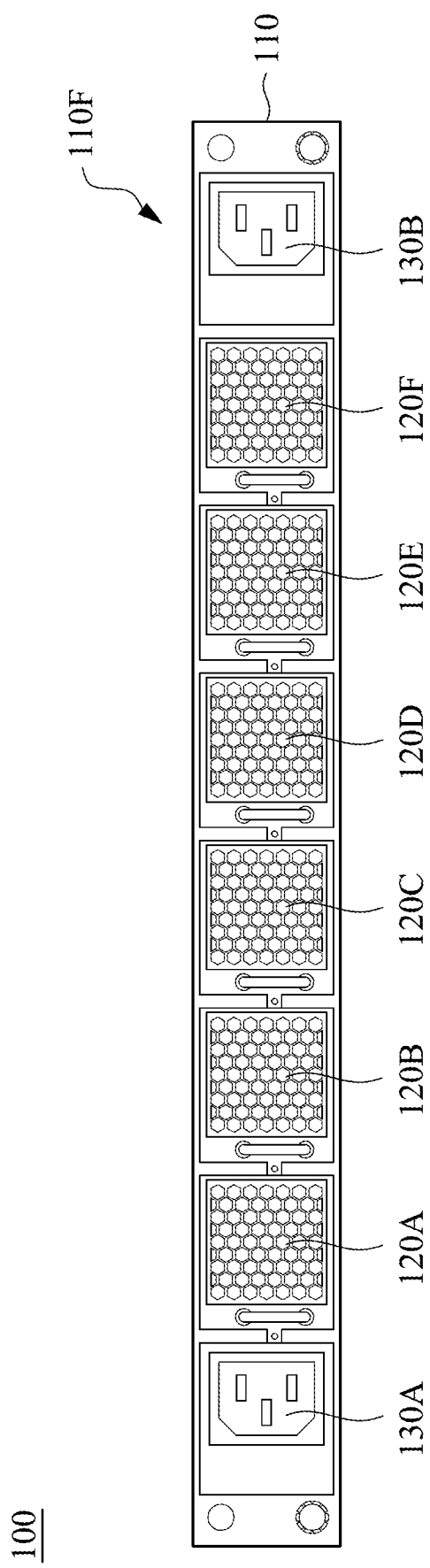
FIG. 1B is a front side view of the server device in FIG. 1A.

FIG. 1A is a schematic perspective view of a server device 100 in accordance with one or more embodiments of the present disclosure, and FIG. 1B is a front side view of the server device 100. The server device 100 may be a blade server, a top-of-rack (ToR) switch, a spine switch or a leaf switch of a data center, or another data device having replaceable fan modules. From the front side of the server device 100, the server device 100 includes a chassis 110, fan modules 120A-120F and power supply modules 130A-130B. The chassis 110 is configured to accommodate and protect internal elements such as chips, circuit boards and various types of electrical components and modules. The fan modules 120A-120F are configured to dissipate heat generated by the server device 100 in the working state, and the power supply modules 130A-130B are configured to supply power to various electrical components of the server device 100. The fan modules 120A-120F and the power supply modules 130A-130B are replaceable. In other words, the fan modules 120A-120F and the power supply modules 130A-130B can be pulled out of the chassis 110 and can be inserted into the chassis 110. As shown in FIGS. 1A and 1B, the fan modules 120A-120F and the power supply modules 130A-130B are all at the front side portion 110F of the chassis 110 when being installed in the chassis 110. However, the arrangement of the fan modules 120A-120F and the power supply modules 130A-130B at the front side portion 110F of the chassis 110 shown in FIGS. 1A and 1B is merely an example and is not intended to limit the scope of the present disclosure. In addition, in some other embodiments, the fan modules 120A-120F and/or the power supply modules 130A-130B may be, for example, at the back side of the server device 100, or respectively at at least two sides of the server device 100. It is noted that the electrical components and modules also included in the server device 100, such as a central processor, a memory and a baseboard management controller (BMC), can vary according to the type and the function thereof, and can be directly implemented by those having ordinary skill in the art; therefore, the description is not given, and the illustration thereof is not shown in the drawings.

Figure 2A:
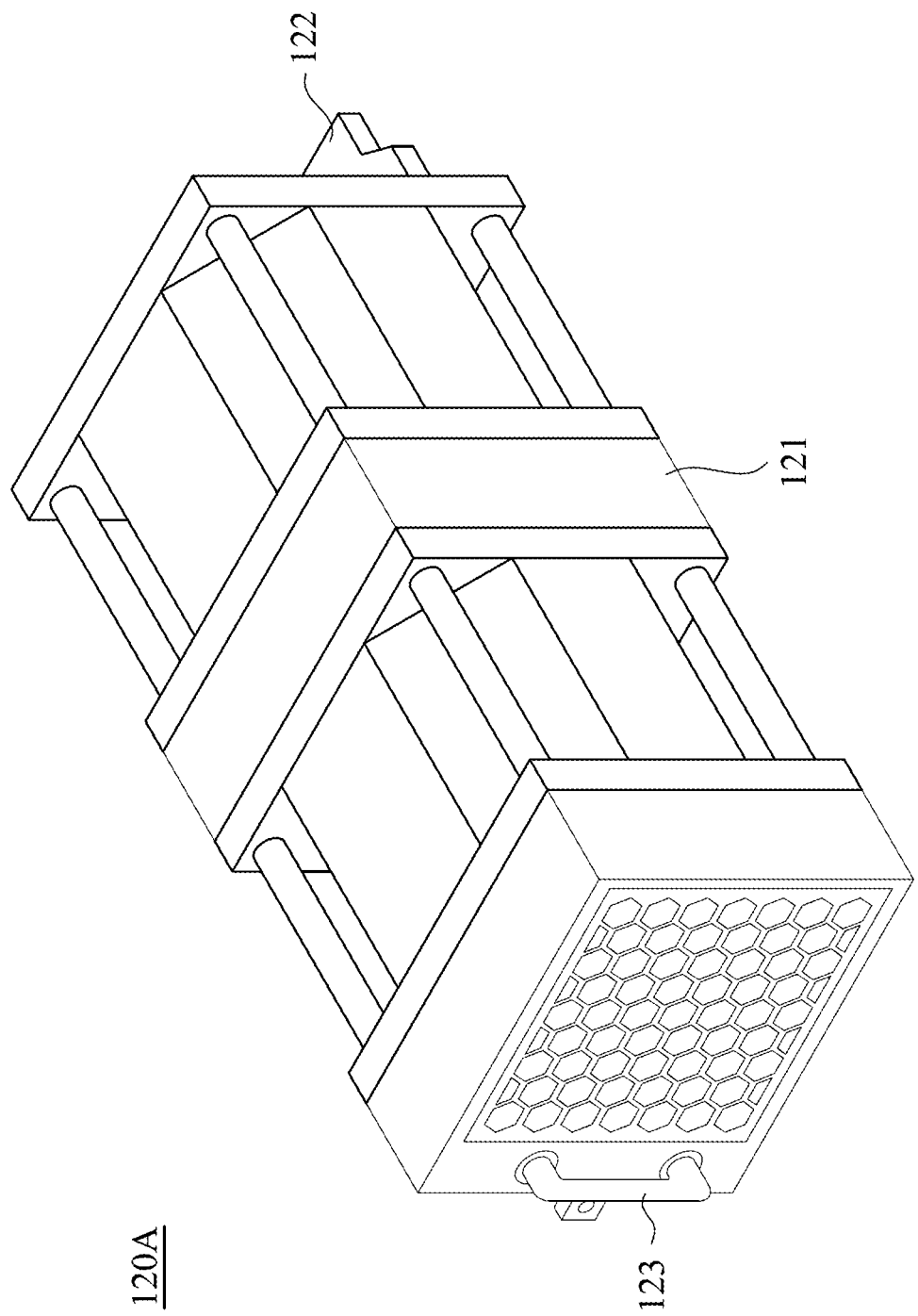
FIGS. 2A and 2B are respectively a schematic perspective view and a simplified planar diagram of each fan module in FIG. 1A.
Figure 2B:
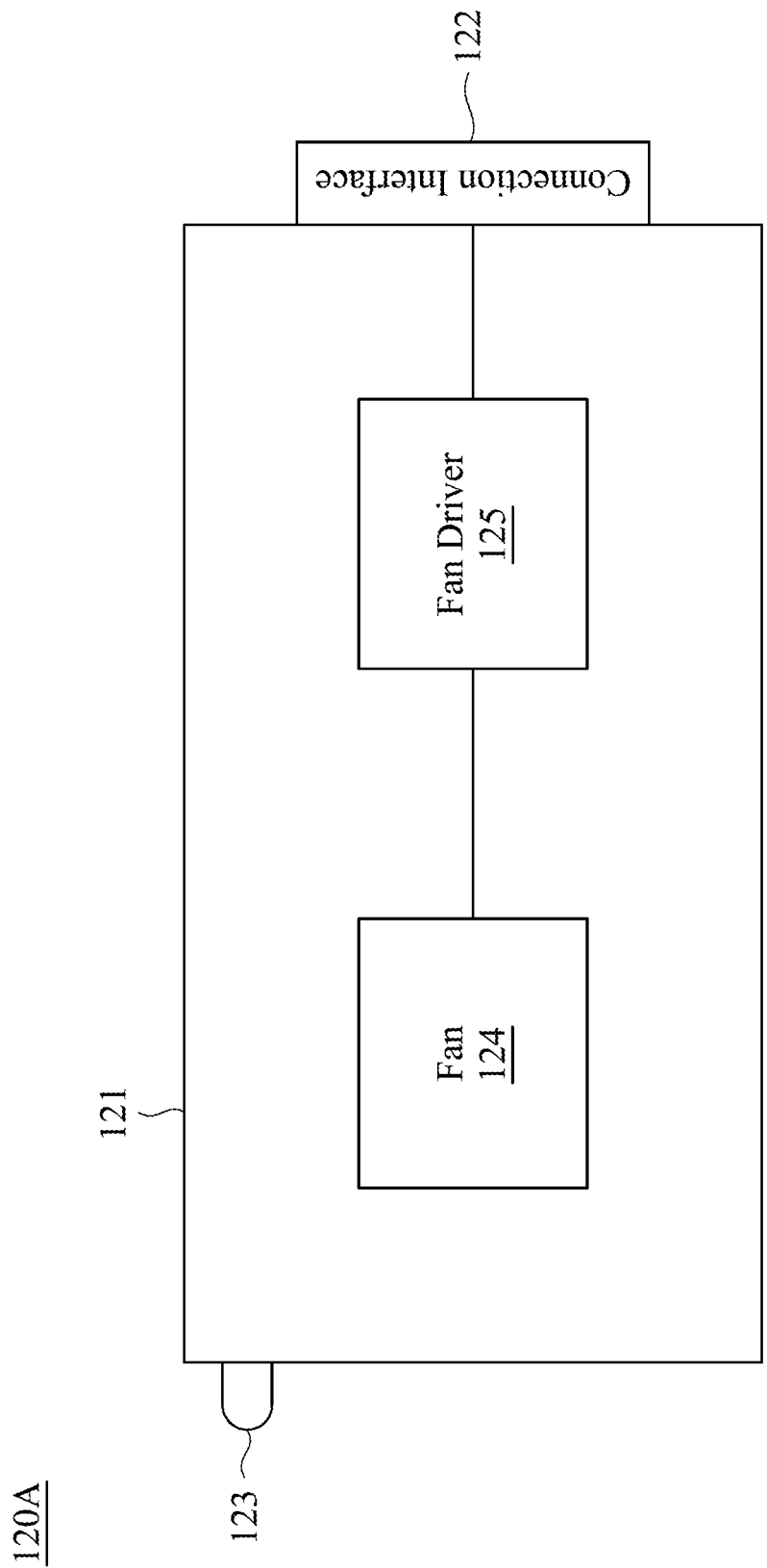

FIGS. 2A and 2B are respectively a schematic perspective view and a simplified planar diagram of the fan module 120A. As shown in FIGS. 2A and 2B, the fan module 120A includes a body 121, a connection interface 122, a handle 123, and a fan 124 and a fan driver 125 inside of the body 121. The connection interface 122 and the handle 123 are at two opposite sides of the body 121, in which the connection interface 122 is used as a signal input/output interface of the fan module 120A and has a connection terminal, and the handle 123 is beneficial for a user to insert the fan module 120A into the chassis 110 and remove the fan module 120A from the chassis 110. In some other embodiments, the fan module 120A does not have the handle 123. That is, the handle 123 may be optional. The fan 124 is configured to expel the hot air in the server device 100 out of the chassis 110 for heat dissipation, and the fan driver 125 is configured to drive the fan 124 to rotate. The fan 124 may be a three-phase brushless direct current (BLDC) fan, and correspondingly the fan driver 125 may be a three-phase motor driving chip. The fan modules 120B-120F may also have the same schematic perspective view as that shown in FIG. 2A and the same schematic planar diagram as that shown in FIG. 2B.

Figure 3:
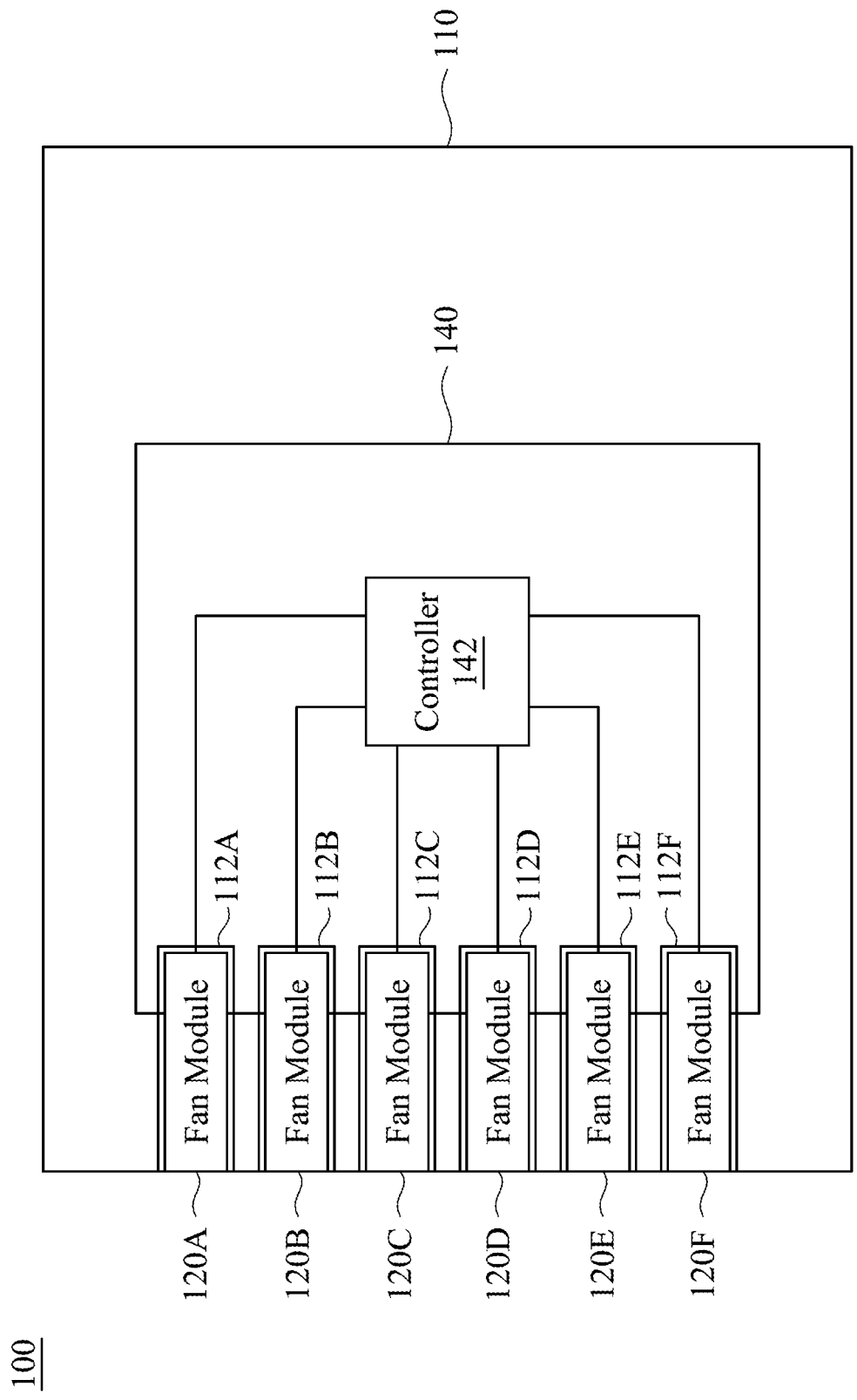
FIG. 3 is a simplified planar diagram showing that the fan modules in FIG. 1A are all installed in a chassis.

FIG. 3 is a simplified planar diagram showing that the fan modules 120A-120F are all installed in the chassis 110. As shown in FIG. 3, the chassis 110 has fan slots 112A-112F adapted to respectively accommodate the fan modules 120A-120F, such that the fan modules 120A-120F are installed in the chassis 110. In various embodiments, the fan slots 112A-112F may be at the front side portion 110F, the back side portion or one of the lateral side portions of the chassis 110, or else can be respectively at at least two sides of the chassis 110.

When the fan modules 120A-120F are completely installed in the chassis 110, the fan modules 120A-120F are all on a fan circuit board 140 of the server device 100, and the controller 142 is coupled to the fan modules 120A-120F via the fan circuit board 140. The fan circuit board 140 includes a connection terminal coupled to the controller 142, and when the fan modules 120A-120F are installed in the chassis 110, the connection terminals thereof contact the connection terminals of the connection interface 122 of the fan modules 120A-120F, so as to detect and transmit control signals to the fan modules 120A-120F. The fan modules 120A-120F, the fan circuit board 140 and the controller 142 may all support hot-swappable operations. As such, the fan modules 120A-120F can be replaced even if the server device 100 is in an operating state. The fan circuit board 140 may be a printed circuit board, and the controller 142 may be a complex programmable logic device (CPLD), a field programmable gate array (FPGA), application-specific integrated circuit (ASIC), a microcontroller, a system on a chip (SoC), or another suitable control circuit.

Figure 4:
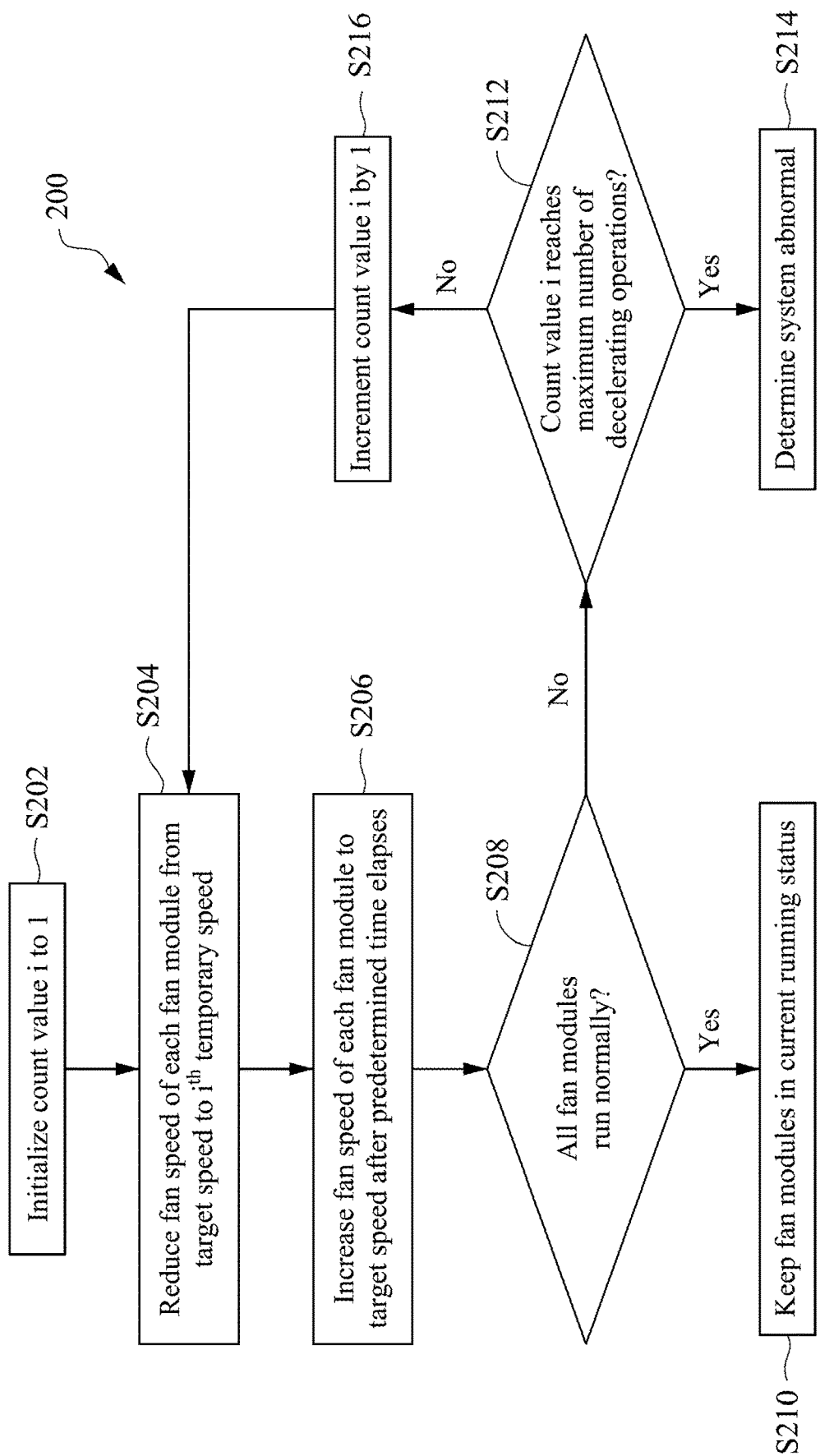
FIG. 4 is a flowchart of a fan control method in accordance with one or more embodiments of the present disclosure.

FIG. 4 is a flowchart of a fan control method 200 in accordance with one or more embodiments of the present disclosure. The fan control method 200 can be performed on the server device 100 or another device with fan modules that are hot-swappable. In the following description, the server device 100 is exemplified, and the fan control method 200 may be performed by the controller 142 in FIG. 3. The fan control method 200 is performed when an event in which a fan module is inserted into the chassis 110 is detected and the other fan modules in the chassis 110 are also running (e.g., the fan module 120A is inserted into the fan slot 112A and the fan modules 120B-120F respectively in the fan slots 112B-112F are running). The above events may include replacing a fan module, pulling out and inserting the same fan module, or another event in which the controller 142 starts coupling to the fan modules.

The steps of the fan control method 200 are described as follows. First, Step S202 is performed, in which the count value i is initialized to 1, and then Step S204 is performed, in which the fan speed of each of the fan modules 120A-120F inserted in the chassis 110 is reduced to an $i^{th}$ temporary speed $FS_i$ for a predetermined time T. After the predetermined time T elapses, Step S206 is performed, in which the fan speed of each of the fan modules 120A-120F is increased to a target speed $FS_o$. The target speed $FS_o$ may be the maximum speed of each of the fan modules 120A-120F, or alternatively may be an optimized speed in a specific environment (e.g., at a specific temperature).

After Step S206 is done, Step S208 is then performed to detect whether all the fan modules 120A-120F run normally. In this step, the controller 142 determines whether the fan speeds of all the fan modules 120A-120F are increased and are approximately kept at the target speed $FS_o$. If yes, then Step S210 is performed to keep fan modules 120A-120F in current running status, and then the fan control method 200 ends. On the contrary, if at least one of the fan modules 120A-120F does not run normally, then Step S212 is performed to determine whether the count value i reaches a maximum number of decelerating operations M.

Step S212 is performed for verifying whether the fan module decelerating operation has been performed M times. If the decelerating operation has been performed M times (i.e. the count value i equals M), then Step S214 is performed to determine a system abnormal condition. It is noted that the reason for causing system abnormal may be damage, deterioration or excessive dust accumulation of the fan module, inaccurate connection of the fan module with the fan circuit board, insufficient power supply voltage, or any other factor that would cause the fan module not to run normally. In Step S214, an abnormal message may also be released to notify a user to handle the system abnormal condition by, such as producing an indicator beep, emitting indicator light and/or sending a digital message to a remote device, but the present disclosure is not limited thereto. On the contrary, if the result of Step S212 is that the count value i still does not reach the maximum number of decelerating operations M, which represents the decelerating operation has been performed less than M times, then Step S216 is performed to increment the count value i by 1, and subsequently Step S204 is performed to reduce the fan speed of each of the fan modules 120A-120F inserted in the chassis 110 to an $i^{th}$ temporary speed $FS_i$, for a predetermined time T. After the count value i is incremented by 1, the $i^{th}$ temporary speed $FS_i$ may be lower than or equal to the $(i-1)^{th}$ temporary speed $FS_{(i-1)}$.

The $i^{th}$ temporary speed $FS_i$ may be linearly reduced with the increasing count value i. For example, the $i^{th}$ temporary speed $FS_i$ may be (50-10×i) % of the target speed $FS_o$, and the maximum number of decelerating operations M may be 5. Alternatively, the $i^{th}$ temporary speed $FS_i$ may be nonlinearly reduced with the increasing count value i. In addition, the predetermined time T may be but not limited to 9 seconds. The $i^{th}$ temporary speed $FS_i$, the predetermined time T and the maximum number of decelerating operations M may be adjusted according to the structure of the server device and/or and operational requirements.

Figure 5:
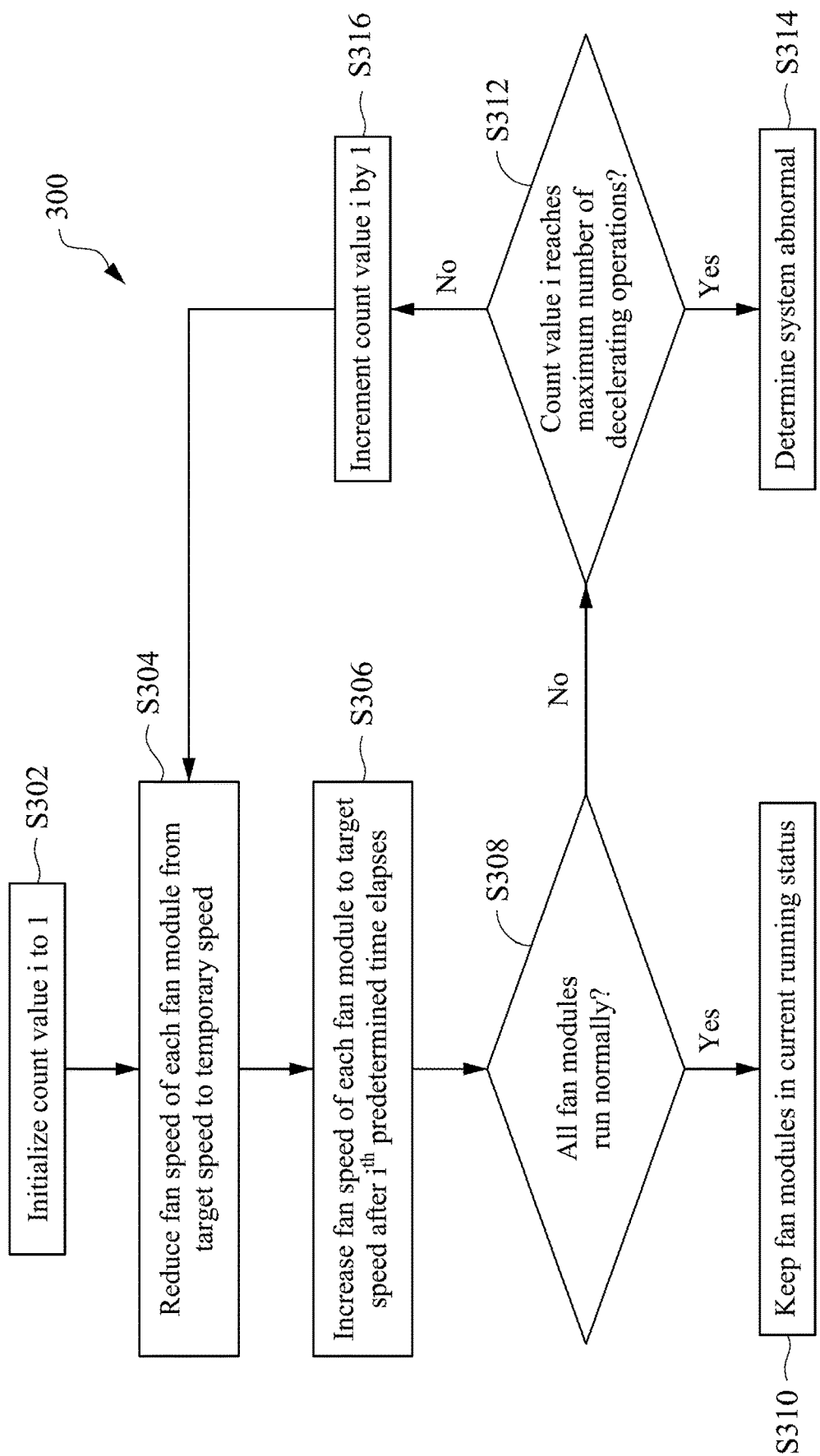
FIG. 5 is a flowchart of a fan control method in accordance with one or more embodiments of the present disclosure.

FIG. 5 is a flowchart of a fan control method 300 in accordance with one or more embodiments of the present disclosure. Similarly, the fan control method 300 is also applicable for the server device 100 or another device with hot-swappable fan modules. In the following description, the server device 100 is exemplified, and the fan control method 300 may be performed by the controller 142 in FIG. 3. The fan control method 300 is performed when an event in which a fan module is inserted into the chassis 110 is detected and the other fan modules in the chassis 110 are also in an operating state (e.g., the fan module 120A is inserted into the fan slot 112A and the fan modules 120B-120F respectively in the fan slots 112B-112F are all in an operating state). The above events may include replacing a fan module, pulling out and inserting the same fan module, or another event in which the controller 142 starts coupling to the fan modules. The steps of the fan control method 300 are described as follows. First, Step S302 is performed, in which the count value i is initialized to 1, and then Step S304 is performed, in which the fan speed of each of the fan modules 120A-120F inserted in the chassis 110 is reduced to the temporary speed FS for an $i^{th}$ predetermined time $T_i$. After the predetermined time $T_i$ elapses, Step S306 is then performed, in which the fan speed of each of the fan modules 120A-120F is increased to a target speed $FS_o$.

After Step S306 is done, Step S308 is then performed to detect whether all the fan modules 120A-120F run normally, i.e., to determine whether the fan speeds of the fan modules 120A-120F are all increased to and are increased and are approximately kept at the target speed $FS_o$. If yes, then Step S310 is performed to keep the fan modules 120A-120F in current running status, and then the fan control method 300 ends. On the contrary, if at least one of the fan modules 120A-120F does not run normally, then Step S312 is performed to determine whether the count value i reaches a maximum number of decelerating operations M.

Step S312 is performed for verifying whether the fan module decelerating operation has been performed M times. If the decelerating operation has been performed M times (i.e. the count value i equals M), then Step S314 is performed to determine a system abnormal condition. In Step S314, an abnormal message may also be released to notify a user to handle the system abnormal condition. On the contrary, if the result of Step S312 is that the count value i still does not reach the maximum number of decelerating operations M, which represents the decelerating operation has been performed less than M times, then Step S316 is performed to increment the count value i by 1, and subsequently Step S304 is performed to reduce the fan speed of each of the fan modules 120A-120F inserted in the chassis 110 to the temporary speed FS for the $i^{th}$ predetermined time $T_i$. After the count value i is incremented by 1, the $i^{th}$ predetermined time $T_i$ may be longer than or equal to the $(i-1)^{th}$ predetermined time $T_{(i-1)}$.

The $i^{th}$ predetermined time $T_i$ may be linearly increased with the increasing count value i. For example, the $i^{th}$ predetermined time $T_i$ may be (i+8) seconds, and the maximum number of decelerating operations M may be 5. Alternatively, the $i^{th}$ predetermined time $T_i$ may be nonlinearly increased with the increasing count value i. Moreover, the temporary speed FS may be equal to or less than 50% of the target speed $FS_o$, but the present disclosure is not limited thereto. The temporary speed FS, $i^{th}$ predetermined time $T_i$ and the maximum number of decelerating operations M may be adjusted according to the structure of the server device and/or and operational requirements.

It is noted that the decelerating operation in the fan control method 200 is to gradually reduce the fan speed while keeping the duration unchanged, and the decelerating operation in the fan control method 300 is to keep the fan speed at the same temporary speed while gradually increasing the duration thereof; in some embodiments, the fan control methods 200 and 300 may be combined, i.e., the decelerating operation is to gradually reduce the fan speed as well as to increase the duration thereof.

As can be seen from the above description, according to embodiments of the present disclosure, the fan speed of each fan module is reduced when an event in which a fan module is inserted into the chassis is detected and the other fan modules in the chassis are also running, and is then increased to a target speed after a predetermined time elapses, so as to prevent the inserted fan module from being unable to be started smoothly due to the internal airflow arisen by the other running fan modules of the server device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A server device, comprising:
    a chassis;
    a plurality of fan modules adapted to be installed in the chassis in a hot-swappable manner; and
    a controller configured to reduce a fan speed of each fan module in the chassis from a target speed to a first temporary speed in response to a fan module insertion event, and then to increase the fan speed of each fan module to the target speed after a first predetermined time elapses,
    wherein after the fan speed of each fan module is increased from the first temporary speed to the target speed, the controller reduces the fan speed of each fan module from the target speed to a second temporary speed that is less than the first temporary speed in response to detection of at least one of the fan modules not running normally, and then increases the fan speed of each fan module from the second temporary speed to the target speed after a second predetermined time elapses, wherein the second predetermined time is longer than the first predetermined time.

2. The server device of claim 1, wherein the first temporary speed is less than or substantially equal to 50 percent of the target speed.

3. The server device of claim 1, wherein the chassis has a plurality of fan slots at at least one side thereof and adapted to respectively accommodate the fan modules.

4. The server device of claim 1, wherein the controller determines a system abnormal condition if at least one of the fan modules not running normally is still detected after a maximum number of decelerating operations on the fan modules.

5. The server device of claim 1, wherein each fan module comprises a three-phase brushless direct current (BLDC) fan, and a three-phase motor driving chip for driving to BLDC fan to rotate.

6. The server device of claim 1, wherein the controller is a complex programmable logic device (CPLD), a field programmable gate array (FPGA), application-specific integrated circuit (ASIC), a microcontroller or a system on a chip (SoC).

7. The server device of claim 1, wherein the chassis comprises a plurality of fan slots adapted to respectively accommodate the fan modules.

8. The server device of claim 1, further comprising:
    a fan circuit board coupled to the controller and configured to detect and transmit control signals to the fan modules.

9. A fan control method for a server device having a chassis and a plurality of fan modules that are installed in the chassis in a hot-swappable manner, the fan control method comprising:
    reducing a fan speed of each fan module in the chassis from a target speed to a first temporary speed in response to an event in which one of the fan modules is inserted into the chassis;
    increasing the fan speed of each fan module to the target speed after a first predetermined time elapses;
    reducing the fan speed of each fan module from the target speed to a second temporary speed that is less than the first temporary speed in response to detection of at least one of the fan modules not running normally after the fan speed of each fan module is increased from the first temporary speed to the target speed; and
    increasing the fan speed of each fan module from the second temporary speed to the target speed after a second predetermined time elapses, wherein the second predetermined time is longer than the first predetermined time.

10. The fan control method of claim 9, wherein the first temporary speed is less than or substantially equal to 50 percent of the target speed.

11. The fan control method of claim 9, further comprising:
    determining a system abnormal condition if at least one of the fan modules not running normally is still detected after a maximum number of decelerating operations on the fan modules.

* * * * *